US012720996B2

(12) United States Patent
Jin et al.

(10) Patent No.: US 12,720,996 B2
(45) Date of Patent: Aug. 25, 2026

(54) DISPLAY PANEL AND DISPLAY DEVICE INCLUDING DISPLAY REGIONS WITH DIFFERENT LIGHT TRANSMITTANCES

(71) Applicant: KUNSHAN GO-VISIONOX OPTO-ELECTRONICS CO., LTD., Kunshan (CN)

(72) Inventors: Yu Jin, Kunshan (CN); Enlai Wang, Kunshan (CN); Yunlei Lu, Kunshan (CN); Lei Li, Kunshan (CN); Penghui Zhang, Kunshan (CN); Mingdong Ma, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 595 days.

(21) Appl. No.: 18/149,933

(22) Filed: Jan. 4, 2023

(65) Prior Publication Data

US 2023/0143862 A1 May 11, 2023

Related U.S. Application Data

(63) Continuation of application No. PCT/CN2021/099574, filed on Jun. 11, 2021.

(30) Foreign Application Priority Data

Sep. 2, 2020 (CN) ......................... 202010910312.1

(51) Int. Cl.
*H10K 59/121* (2023.01)
*H10K 59/122* (2023.01)
(Continued)

(52) U.S. Cl.
CPC ..... *H10K 59/8051* (2023.02); *H10K 59/1213* (2023.02); *H10K 59/122* (2023.02);
(Continued)

(58) Field of Classification Search
CPC ........... H10K 59/8051; H10K 59/1213; H10K 59/122; H10K 59/60; H10K 2102/101;
(Continued)

(56) References Cited

U.S. PATENT DOCUMENTS

2015/0084017 A1* 3/2015 Dai ...................... H10K 50/854 257/40
2016/0351649 A1* 12/2016 Li ........................ H10K 59/122
(Continued)

FOREIGN PATENT DOCUMENTS

CN 103715135 A * 4/2014 .......... H10W 70/611
CN 108134013 A 6/2018
(Continued)

OTHER PUBLICATIONS

LI; Jun, CN-109062431-A, Machine Translation (Year: 2018).*
(Continued)

*Primary Examiner* — Jacob Y Choi
*Assistant Examiner* — Grace Cha
(74) *Attorney, Agent, or Firm* — Quarles & Brady LLP

(57) ABSTRACT

The present application relates to a display panel and a display device. The display panel includes a substrate, a driving layer group, and an anode layer stacked together. The driving layer group is located in the second display region. The anode layer includes a first anode located in the first display region. The first anode is electrically connected to a drain of the driving layer group via a conducting wire. The display panel further includes a first isolation layer and a lap layer located in the first display region. The first isolation layer is arranged between the lap layer and the conducting wire. The first isolation layer includes a first via hole. The conducting wire passes through the first via hole to connect with the lap layer, to electrically connect the first anode to the drain electrode of the driving layer group.

19 Claims, 3 Drawing Sheets

(51) Int. Cl.
*H10K 59/60* (2023.01)
*H10K 59/80* (2023.01)
*H10K 102/00* (2023.01)
*H10K 102/10* (2023.01)

(52) U.S. Cl.
CPC ....... *H10K 59/60* (2023.02); *H10K 2102/101* (2023.02); *H10K 2102/302* (2023.02)

(58) Field of Classification Search
CPC ........... H10K 2102/302; H10K 59/131; H10K 59/65; H10K 59/12
See application file for complete search history.

(56) References Cited

U.S. PATENT DOCUMENTS

| | | | | |
|---|---|---|---|---|
| 2021/0327958 | A1* | 10/2021 | Li | H10K 59/353 |
| 2022/0173185 | A1 | 6/2022 | Jin et al. | |

FOREIGN PATENT DOCUMENTS

| | | | | |
|---|---|---|---|---|
| CN | 109062431 | A * | 12/2018 | G06F 3/0412 |
| CN | 110189639 | A | 8/2019 | |
| CN | 111162199 | A | 5/2020 | |
| CN | 112038374 | A | 12/2020 | |
| EP | 1717877 | A2 | 11/2006 | |
| KR | 20050121425 | A | 12/2005 | |

OTHER PUBLICATIONS

Feng; Bin, CN-103715135-A, Machine Translation (Year: 2013).*
International Search Report (International Application No. PCT/CN2021/099574) with English Translation, dated Sep. 22, 2021, 5 pages.
Written Opinion (International Application No. PCT/CN2021/099574) with English Translation, dated Sep. 22, 2021, 7 pages.
First Office Action (CN Application No. 2020109103121) with English Translation, dated Jun. 8, 2022, 11 pages.
Decision of Rejection (CN Application No. 2020109103121) with English Translation, dated Nov. 2, 2022, 7 pages.

* cited by examiner

DISPLAY PANEL AND DISPLAY DEVICE INCLUDING DISPLAY REGIONS WITH DIFFERENT LIGHT TRANSMITTANCES

CROSS-REFERENCE TO RELATED APPLICATIONS

This application is a continuation of international patent application PCT/CN2021/099574, filed on Jun. 11, 2021, entitled "DISPLAY PANEL AND DISPLAY DEVICE", which claims priority to Chinese Patent Application No. 202010910312.1, filed on Sep. 2, 2020, entitled "DISPLAY PANEL AND DISPLAY DEVICE". The contents of the above-identified applications are hereby incorporated by reference in their entireties.

TECHNICAL FIELD

The present disclosure relates to the field of display technology, in particular to a display panel and a display device.

BACKGROUND

With the rapid development of electronic devices, users have higher and higher requirements for screen-to-body ratio, making full-screen display of electronic devices attract more and more attention in the industry. Conventional electronic devices such as mobile phones, tablet computers, etc. are commonly integrated with front cameras, earpieces and infrared sensing elements, etc. The display screens are notched, and the cameras, earpieces and infrared sensing components, etc. are arranged in the notched regions. However, these electronic devices do not realize real full screen, as not all regions of the entire screen can be used in displaying an image. For example, a camera region in the screen cannot be used in displaying an image.

In order to achieve a real full-screen display, the under-screen camera technology came into being, by which the camera region of the display screen can still be configured for display. However, an unfavorable condition of dark spots may occur in this region during normal display.

SUMMARY

In view of this, the present disclosure provides a display panel and a display device, which can avoid the dark spot defects occurring in normal display in a region of the display panel under which a photosensitive device is correspondingly arranged.

A display panel is provided according to an aspect of the present disclosure. The display panel includes a first display region and a second display region adjacent to and connected to the first display region. A light transmittance of the first display region is higher than a light transmittance of the second display region. The display panel includes a substrate, a driving layer group, and an anode layer stacked together. The driving layer group is located in the second display region. The anode layer includes a first anode located in the first display region. The first anode is electrically connected to a drain electrode of the driving layer group via a conducting wire. The display panel further includes a first isolation layer and a lap layer located in the first display region. The first isolation layer is arranged between the lap layer and the conducting wire. The first isolation layer includes a first via hole. The conducting wire passes through the first via hole to connect with the lap layer, to electrically connect the first anode to the drain electrode of the driving layer group.

A display device is provided according to another aspect of the present disclosure. The display device includes the aforementioned display panel.

In the aforementioned display panel and display device, by providing the first isolation layer, the conducting wire has to extend through the first via hole of the first isolation layer to be in contact with the lap layer. The lap layer is configured as an intermediate medium connected between the first anode and the conducting wire, thereby avoiding a large contact resistance caused by direct contact between the first anode and the conducting wire. Moreover, as the conducting wire is in contact with the lap layer through the first via hole of the first isolation layer, the first via hole controls the contact area of the conducting wire and the lap layer. Thus, by avoiding directly forming the conducting wire on the lap layer, a large contact resistance caused by a large contact area of the two members can be avoided. Accordingly, a low-resistance contact is formed between the conducting wire and the lap layer through the first via hole, thereby reducing the influence of the contact impedance on the electric potential of the first anode, to reduce the influence on the voltage difference between the first anode and the first cathode of the first display region, which avoids the unfavorable condition of dark spots in the first display region.

DETAILED DESCRIPTION

To facilitate understanding of the present disclosure, the present disclosure will be described more thoroughly hereinafter with reference to the related drawings. Embodiments of the present disclosure are given in the accompanying drawings. However, the present disclosure may be implemented in many different forms and is not limited to the embodiments described herein. Rather, these embodiments are provided to facilitate a thorough and complete understanding of the disclosure of the present disclosure.

As there is a need to integrate a smart electronic device such as a mobile phone, a tablet computer, etc. with a photosensitive device such as a front camera, a light sensor, etc., a first display region is arranged in a display panel of the electronic device, and the photosensitive device is commonly disposed under the first display region. Full-screen display of the electronic device is realized while ensuring the normal operation of the photosensitive device.

However, when the display panel of the electronic device is in operation, dark spots may appear in the first display region. Through long-term research, the inventors have found the reason for this problem: To improve the light transmittance of the first display region, the elements in the first display region, such as an anode of a sub-pixel and a conducting wire, are commonly made of transparent oxide materials. A lap layer needs to be disposed under the position where the anode of the sub-pixel and the conducting wire overlap in the first display region to reflect light, which facilitates the formation of a via hole in the planarization layer. However, the resistivity of the transparent oxide materials is relatively large, and the contact resistance between the conducting wire and the lap layer in the first display region is relatively large. Therefore, the electric potential of the anode is greatly reduced, which reduces the voltage difference between the anode and the cathode of the light-emitting device in the first display region, so that the unfavorable condition of dark spots occurs in the first display region.

In view of this, there is a need to provide a display panel and a display device to avoid dark spot defects occurring in the first display region.

Figure 1:
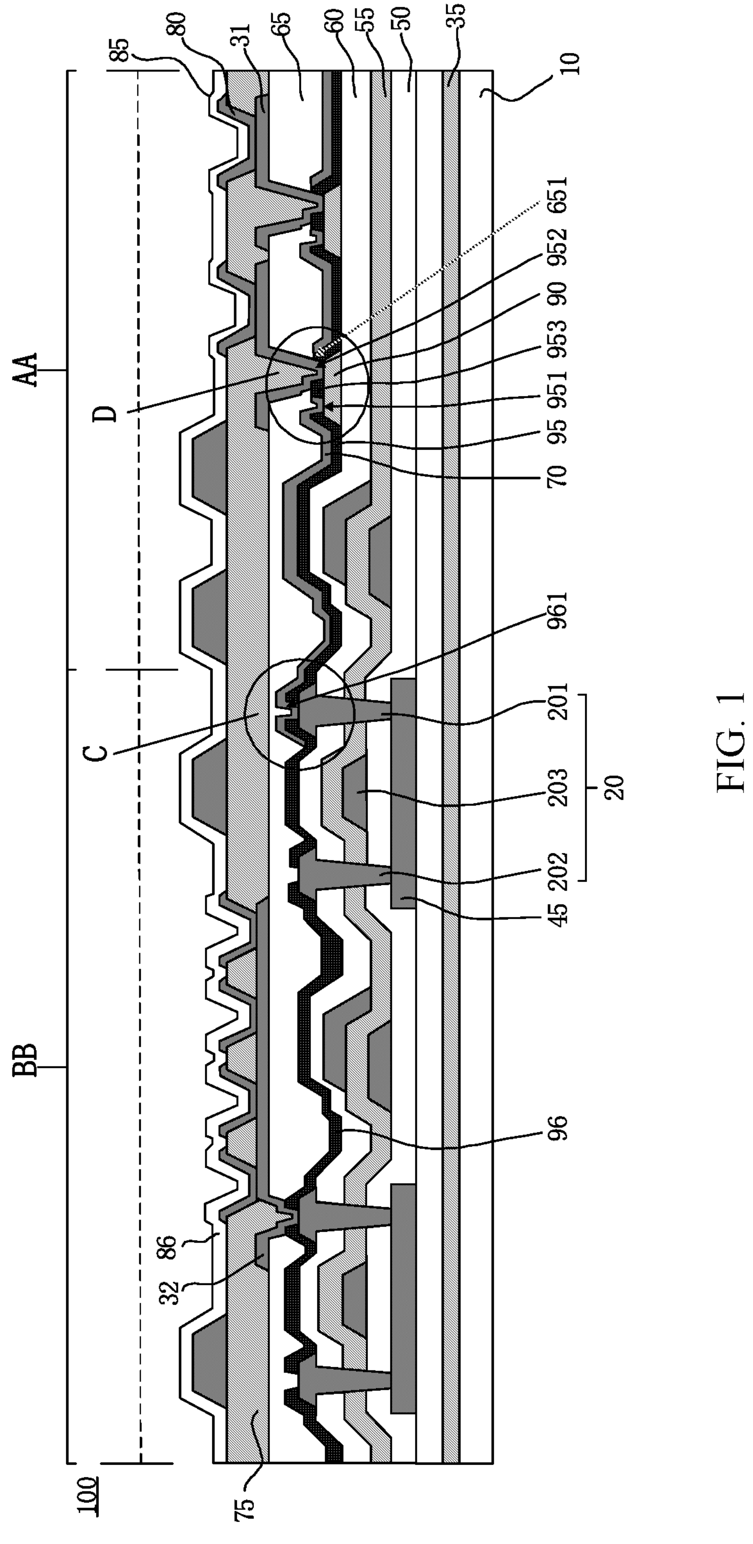
FIG. 1 is a schematic sectional view of a display panel according to an embodiment of the present disclosure.
Figure 2:
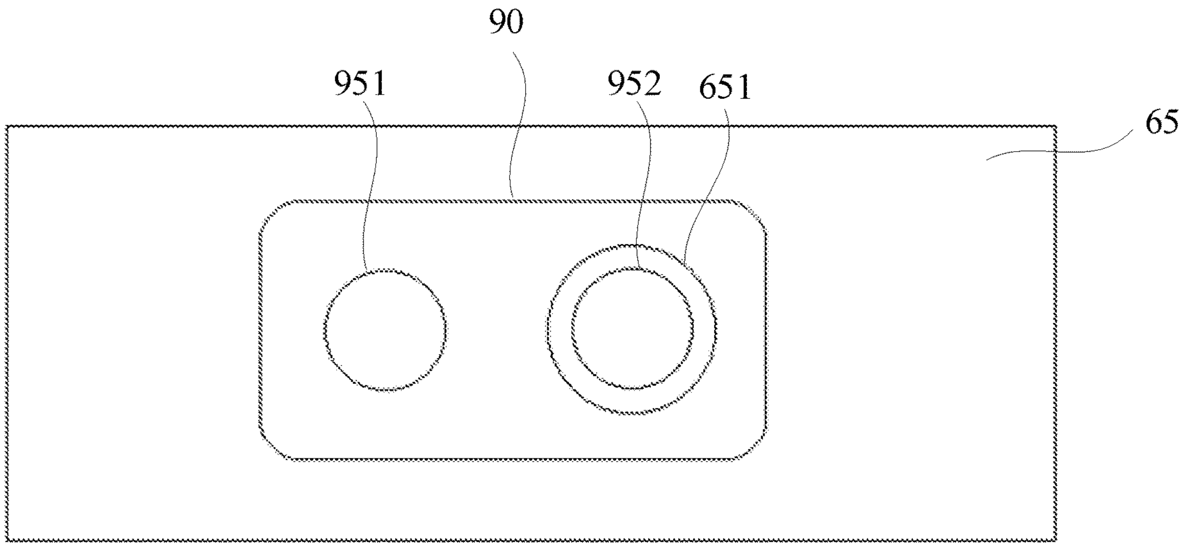
FIG. 2 is a schematic top view of a contact between a first anode and a conducting wire through a lap layer of the display panel shown in FIG. 1.

Referring to FIGS. 1 and 2, a display panel 100 in an embodiment of the present disclosure includes a first display region AA and a second display region BB adjacent to and connected to the first display region AA. The light transmittance of the first display region AA is higher than the light transmittance of the second display region BB.

Specifically, a photosensitive device is correspondingly disposed under the first display region AA, and the photosensitive device collects light through the first display region AA. The photosensitive device can be, for example, an image sensor of a camera, a fingerprint recognition sensor, etc. The region under the first display region AA is the region where the photosensitive device is arranged. The first display region AA not only realizes the display function but also has a sufficiently high light transmittance to ensure the accuracy of photo sensing or recognition of the photosensitive device. The second display region BB is a normal display region, and no photosensitive device is provided under the second display region BB.

The display panel 100 includes a substrate 10, a driving layer group 20, and an anode layer stacked together.

The substrate 10 can be made of glass or an organic material, having elasticity and ductility, such as polyimide (PI). Specifically, the substrate 10 can be made of a thermoplastic polyurethane (TPU) material, which not only has good tensile properties, but also has good water and oxygen resistance properties.

The display panel 100 further includes a buffer layer 35 located on the substrate 10, a semiconductor layer 45 located on the buffer layer 35, a gate insulating layer 50 formed on the semiconductor layer 45, a capacitor insulating layer 55 located on the gate insulating layer 50, an interlayer dielectric layer 60 located on the capacitor insulating layer 55, and a planarization layer 65 located on the interlayer dielectric layer 60.

The driving layer group 20 is located in the second display region BB. The driving layer group 20 can specifically include a drain electrode 201, a source electrode 202, and a gate electrode 203. The gate electrode 203 is located between the gate insulating layer 50 and the capacitor insulating layer 55. The source electrode 202 and the drain electrode 201 are located on the interlayer dielectric layer 60 and are in contact with the semiconductor layer 45 through the via holes in the gate insulating layer 50, the capacitor insulating layer 55, and the interlayer dielectric layer 60.

The anode layer includes a first anode 31 located in the first display region AA and a second anode 32 located in the second display region BB. The first anode 31 is electrically connected to the drain electrode 201 of the driving layer group 20 through the conducting wire 70.

Specifically, the anode layer is located above the planarization layer 65. The display panel 100 further includes a pixel defining layer 75 and an organic light-emitting layer 80 located on the planarization layer 65 and the anode layer, and a first cathode 85 located in the first display region AA and a second cathode 86 located in the second display region BB. In the first display region AA, the organic light emitting layer 80 is located between the first anode 31 and the first cathode 85. In the second display region BB, the organic light emitting layer 80 is located between the second anode 32 and the second cathode 86. More specifically, the display panel 100 includes a lap layer 90 located in the first display region AA. In the first display region AA, the first anode 31 is in contact with the lap layer 90 through a third via hole 651 in the planarization layer 65, so that the first anode 31 is electrically connected to the conducting wire 70 which is electrically connected to the lap layer 90.

No driving layer group, which is light-shielding, is disposed in the first display region AA, so that the light transmittance of the first display region AA is relatively high. The second display region BB includes driving layer groups 20. The driving layer groups 20 not only provide a driving current to the corresponding organic light-emitting layer 80 in the second display region BB, but also provide a driving current to the corresponding organic light-emitting layer 80 in the first display region AA. That is, the driving layer groups 20 respectively driving the organic light-emitting layer 80 of the second display region BB and the organic light-emitting layer 80 of the first display region AA, and the driving layer groups 20 are both arranged in the second display region BB, so that the conducting wire 70 is needed in order to realize the electrical connection between the first anode 31 located in the first display region AA and the driving layer group 20 located in the second display region BB. The first anode 31 in the first display region AA receives a driving current provided by the corresponding driving layer group 20 in the second display region BB to realize the display function of the first display region AA.

More specifically, in the first display region AA, the organic light emitting layer 80 is located between the first anode 31 and the first cathode 85. When the first anode 31 is driven by the driving layer group 20 to obtain a positive voltage, the organic light-emitting layer 80 is excited to produce visible light. Depending on the magnitude of the voltage, the light has a different brightness. According to different materials, the sub-pixel can be a red sub-pixel, a green sub-pixel, or a blue sub-pixel, and the corresponding organic light-emitting layer 80 can emit red light, green light, or blue light.

In some embodiments, the first anode 31 is made of a transparent conductive material. For example, a transparent conductive material can be a transparent metal oxide material. The transparent conductive material can be indium tin oxide (ITO), indium zinc oxide (IZO), silver-doped indium tin oxide (Ag+ITO), or silver-doped indium zinc oxide (Ag+IZO). Due to the mature technology and low cost of ITO, the conductive material is indium tin oxide in an embodiment. Further, to reduce the resistance of each electrical conducting wire while ensuring high light transmittance, the transparent conductive material can be made of aluminum-doped zinc oxide, silver-doped ITO, silver-doped IZO, etc. In other alternative embodiments, the transparent conductive material can also be made of other materials, which can be reasonably selected according to actual needs, and is not limited in this application.

Figure 3A:
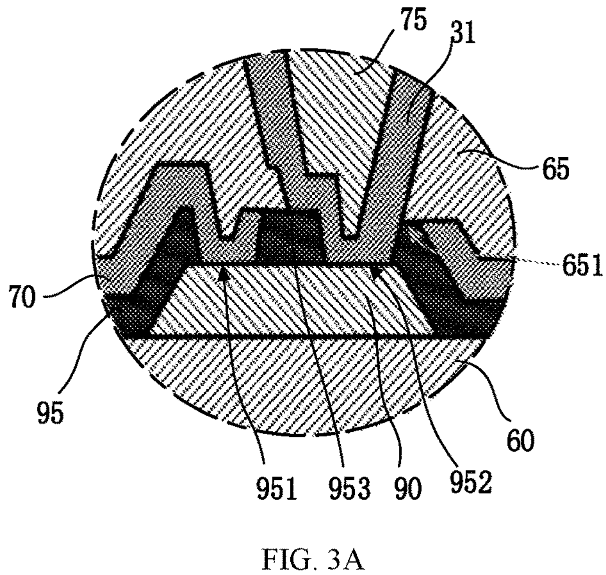
FIG. 3A is a partial, enlarged view of an embodiment of a region D of FIG. 1.

Referring to FIG. 2 and FIG. 3A, the display panel 100 further includes a first isolation layer 95 located in the first display region AA. The first isolation layer 95 is disposed between the lap layer 90 and the conducting wire 70. The first isolation layer 95 includes a first via hole 951. The conducting wire 70 is in contact with the lap layer 90 through the first via hole 951, to electrically connect the first anode 31 to the drain electrode 201 of the driving layer group 20.

Figure 3B:
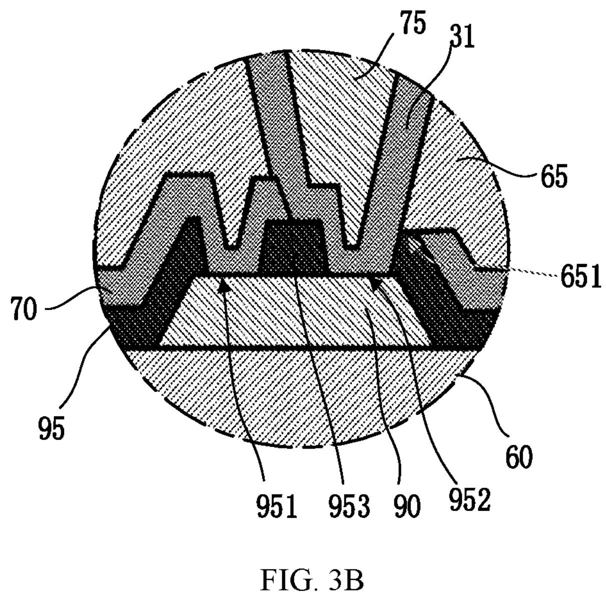
FIG. 3B is a partial, enlarged view of another embodiment of the region D of FIG. 1.

Further, the first isolation layer 95 also includes a second via hole 952, and the first anode 31 is connected with the lap layer 90 through the second via hole 952. As such, the first anode 31 passes through the third via hole 651 of the planarization layer 65 and the second via hole 952 of the first isolation layer 95 to connect with the lap layer 90. Compared with the case that the first anode 31 is directly in contact with and electrically connected to the conducting wire 70 when no lap layer 90 is provided, the resistance in the circuit is smaller in the case that the first anode 31 is electrically connected to the conducting wire 70 through the lap layer 90, which is beneficial to reduce an impedance of an electrical connection between the first anode 31 and the conducting wire 70. In another embodiment, referring to FIG. 3B, the first anode 31 can also be directly connected to the conducting wire 70. Specifically, the first anode 31 is connected to the conducting wire 70 through the third via 651 of the planarization layer 65. In other embodiments, the connection between the first anode 31 and the conducting wire 70 can be a combination of the above two embodiments, that is, while the first anode 31 is connected to the conducting wire 70 through the lap layer 90, the first anode 31 is also directly connected to the conducting wire 70. Those skilled in the art should know that when there are two current flow routes in the circuit, the current usually flows to the route with lower resistance. In an embodiment of the present disclosure, the resistance of the route in which the first anode 31 is connected to the lap layer 90 through the third via hole 651 of the planarization layer 65 and the second via hole 952 of the first isolation layer 95 in sequence is lower than the resistance of the route in which the first anode 31 is directly connected to the conducting wire 70.

In an embodiment, the diameter of the first via hole 951 is 5 micrometers, the diameter of the second via hole 952 is also 5 micrometers, and the diameter of the third via hole 651 is 8 micrometers. At least one of the first via hole 95, the second via hole 952, and the third via hole 651 has a round shape. In other embodiments, the first via hole 951, the second via hole 952, and the third via hole 651 can have a polygonal shape, which is not limited herein.

In some embodiments, the lap layer 90 can be made of at least one of molybdenum, titanium, aluminum, magnesium, silver, gold, copper, zinc, chromium, nickel, or tungsten. The resistivities of the aforementioned materials are relatively small and the properties thereof are relatively stable. The lap layer 90 can be fabricated in the same layer with the drain electrode 201 and the source electrode 202 of the driving layer group 20 in the second display region BB.

Further, in an extending direction of the lap layer 90, a width of the lap layer 90 can change continuously or change intermittently, and a space between two adjacent lap layers 90 can change continuously or change intermittently. In this way, the positions of diffraction fringes generated by the lap layers 90 in different widths and different spaces are different, and the diffraction fringes at different positions cancel each other so that the diffraction effect can be effectively weakened, thereby ensuring high accuracy of an image captured by a camera disposed under the first display region AA.

Furthermore, along the extending direction of the lap layer 90, at least a portion of an edge of the lap layer 90 can be arc-shaped or wave-shaped. By making the edge of the lap layer 90 arc-shaped or wave-shaped, a width of the lap layer 90 can be continuously or intermittently changed, and the space between two adjacent lap layers 90 can be continuously or intermittently changed. The cross-sectional shape of the lap layer 90 can be, for example, a circle, an ellipse, or the like.

In some embodiments, the first isolation layer 95 can be made of a material selected from polyethylene terephthalate (PET), polypropylene (PP), polyethylene (PE), polystyrene (PS), polycarbonate (PC), acrylic, polyvinyl chloride (PVC), or fluororesin. The aforementioned materials are all transparent resins with electrical insulating properties. In other embodiments, the first isolation layer 95 and the planarization layer 65 can be made of the same material.

In this way, by providing the first isolation layer 95, the conducting wire 70 has to pass through the first via hole 951 of the first isolation layer 95 to be in contact with the lap layer 90. The lap layer 90 is configured as an intermediate medium connected between the first anode 31 and the conducting wire 70, thereby avoiding a large contact resistance formed by direct contact between the first anode 31 and the conducting wire 70. Moreover, as the conducting wire 70 is in contact with the lap layer 90 through the first via hole 951 of the first isolation layer 95, the contact area of the conducting wire 70 and the lap layer 90 is controlled. Thus, by avoiding directly forming the conducting wire 70 on the lap layer 90, a large contact resistance caused by a large contact area of the two members can be avoided.

In the display device 100 of the present disclosure, a low-resistance contact is formed between the conducting wire 70 and the lap layer 90 through the first via hole 951, thereby reducing the influence of the contact impedance on the electric potential of the first anode 31, to reduce the influence on the voltage difference between the first anode 31 and the first cathode 85 in the first display region AA, which avoids the unfavorable condition of dark spots in the first display region AA.

In some embodiments, an orthographic projection of a side of the first via hole 951 adjacent to the lap layer 90 on the lap layer 90 is located in the lap layer 90. In this way, when the conducting wire 70 is in contact with the lap layer 90 through the first via hole 951, a contact area formed between the conducting wire 70 and the lap layer 90 is smaller than a contact area formed between the conducting wire 70 and the lap layer 90 when no first isolation layer 95 is provided.

In some embodiments, the lap layer 90 includes a first flat region and a first climbing region. The first climbing region is adjacent to and connected to the first flat region. The orthographic projection of the side of the first via hole 951 adjacent to the lap layer 90 on the lap layer 90 is located in the first flat region.

The first flat region has a flat surface compared with the first climbing region. Specifically, the first flat region is parallel to a longitudinal direction of the display panel 100, and the first climbing region is disposed obliquely toward the substrate 10. By arranging the orthographic projection of the side of the first via hole 951 adjacent to the lap layer 90 on the lap layer 90 in the first flat region, it can be ensured that the conducting wire 70 and the lap layer 90 are reliably in contact with each other and the contact area can be as small as possible to reduce the contact resistance between the conducting wire 70 and the lap layer 90. In contrast, when no first isolation layer 95 is provided, the conducting wire 70 is easily broken on the first climbing region, resulting in large contact resistance. The orthographic projection of the side of the first via hole 951 adjacent to the lap layer 90 on the lap layer 90 is located in the first flat region, which can avoid the climbing of the conducting wire 70, and thus can ensure that large contact resistance is not easily generated between the conducting wire 70 and the lap layer 90.

In some embodiments, the first isolation layer 95 includes a support region 953 located between the first via hole 951 and the second via hole 952, and the first anode 31 and the conducting wire 70 are supported by the support region 953. By arranging the support region 953, it is more favorable for the formation of the first anode 31 and the conducting wire 70 on the first isolation layer 95, to achieve reliable contact between the first anode 31 and the lap layer 90, and between the conducting wire 70 and the lap layer 90, respectively through the second via hole 952 and the first via hole 951.

Figure 4:
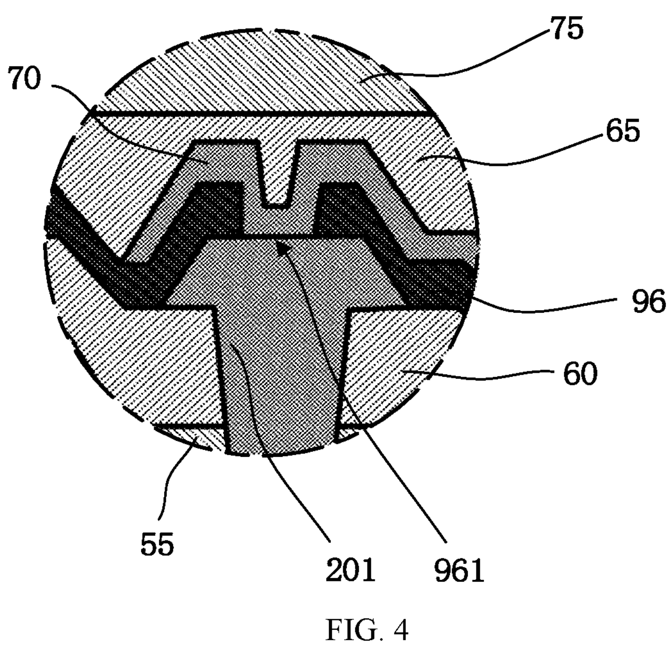
FIG. 4 is a partial, enlarged view of a region C of FIG. 1.

In some embodiments, the display panel 100 further includes a second isolation layer 96 located in the second display region BB. The second isolation layer 96 is disposed between the driving layer group 20 and the conducting wire 70. The second isolation layer 96 includes a fourth via hole 961. The conducting wire 70 is connected to the driving layer group 20 through the fourth via hole 961. Specifically, referring to FIG. 4, the conducting wire 70 is in contact with the drain electrode 201 of the driving layer group 20 through the fourth via hole 961. In this way, the contact area of the conducting wire 70 and the driving layer group 20 can be controlled, and directly forming the conducting wire 70 on the driving layer group 20 can be avoided, to avoid a large contact resistance resulting from the large contact area of the conducting wire 70 and the driving layer group 20.

Further, the driving layer group 20 includes a second flat region and a second climbing region. The second climbing region is adjacent to and connected to the second flat region. An orthographic projection of a side of the fourth via hole 961 adjacent to the driving layer group 20 on the driving layer group 20 is located in the second flat region. In this way, it can be ensured that the conducting wire 70 and the driving layer group 20 are reliably in contact with each other, and the contact area can be as small as possible to reduce the contact resistance between the conducting wire 70 and the driving layer group 20.

In some embodiments, the first isolation layer 95 and the second isolation layer 96 are located in the same layer. Further, the first isolation layer 95 is connected to the second isolation layer 96. Furthermore, the first isolation layer 95, and the second isolation layer 96 forms an integrated layer structure. In this way, the manufacturing time of the first isolation layer 95 and the second isolation layer 96 can be reduced, and the manufacturing efficiency of the display panel 100 can be improved.

Based on the same concept, the present application also provides a display device including the aforementioned display panel 100. Specifically, the display device further includes a photosensitive device. The photosensitive device is disposed under the first display region AA. The photosensitive device can be an image sensor of a camera, a fingerprint recognition sensor, etc.

In the display panel 100 and the display device of the present disclosure, by providing the first isolation layer 95, the conducting wire 70 has to pass through the first via hole 951 of the first isolation layer 95 to be in contact with the lap layer 90. The lap layer 90 is configured as an intermediate medium connected between the first anode 31 and the lap layer 90, thereby avoiding a large contact resistance formed by direct contact between the first anode 31 and the conducting wire 70. Moreover, as the conducting wire 70 is in contact with the lap layer 90 through the first via hole 951 of the first isolation layer 95, the contact area of the conducting wire 70 and the lap layer 90 is controlled. Thus, by avoiding directly forming the conducting wire on the lap layer 90, a large contact resistance caused by a large contact area of the two members can be avoided. Thus, a low-resistance contact is formed between the conducting wire 70 and the lap layer 90 through the first via hole 951, thereby reducing the influence of the contact impedance on the electric potential of the first anode 31, to reduce the influence on the voltage difference between the first anode 31 and the first cathode 85 in the first display region AA, which avoids the unfavorable condition of dark spots in the first display region AA.

The aforementioned embodiments are only several embodiments of the present disclosure, and the descriptions thereof are relatively specific and detailed, but should not be construed as a limitation on the scope of the present disclosure. It should be noted that, for a person of ordinary skill in the art, variations and improvements can be made without departing from the concept of the present disclosure, and these are all within the protection scope of the present disclosure. Therefore, the protection scope of the present disclosure shall be subject to the appended claims.

What is claimed is:

1. A display panel comprising a first display region and a second display region adjacent to and connected to the first display region, wherein a light transmittance of the first display region is higher than a light transmittance of the second display region;

wherein the display panel comprises a substrate, a driving layer group, and an anode layer stacked together;

wherein the driving layer group is located in the second display region, the anode layer comprises a first anode located in the first display region, and the first anode is electrically connected to a drain electrode of the driving layer group via a conducting wire;

wherein the display panel further comprises a first isolation layer and a lap layer located in the first display region, the first isolation layer is arranged between the lap layer and the conducting wire; and wherein the first isolation layer comprises a first via hole, and the conducting wire passes through the first via hole, extending through an entire thickness of the first isolation layer to connect with the lap layer, thereby electrically connecting the first anode to the drain electrode of the driving layer group;

wherein the first isolation layer comprises a second via hole, and the first anode is connected with the lap layer through the second via hole, the first isolation layer comprises a support region located between the first via hole and the second via hole, the first via hole is separated from the second via hole by the support region.

2. The display panel according to claim 1, wherein an orthographic projection of a side of the first via hole adjacent to the lap layer on the lap layer is located in the lap layer.

3. The display panel according to claim 1, wherein the lap layer comprises a first flat region and a first climbing region, the first climbing region is disposed obliquely toward the substrate, and the first climbing region is adjacent to and connected to the first flat region; and wherein the orthographic projection of the side of the first via hole adjacent to the lap layer on the lap layer is located in the first flat region.

4. The display panel according to claim 1, wherein a material of the first isolation layer is selected from the group comprising polyethylene terephthalate, polypropylene, polyethylene, polystyrene, polycarbonate, acrylic, polyvinyl chloride, fluororesin, and any combination thereof.

5. The display panel according to claim 1, wherein and the first anode and the conducting wire are supported by the support region.

6. The display panel according to claim 1, further comprising a planarization layer located below the anode layer, wherein the planarization layer comprises a third via hole, and the first anode passes through the third via hole and the second via hole in sequence to connect with the lap layer;

wherein the first anode and the conducting wire are located in different layers; and wherein the first anode satisfies (i) or (ii):

(i) the first anode is electrically connected to the conducting wire through the lap layer;

(ii) while the first anode is connected to the conducting wire through the lap layer, the first anode is also directly connected to the conducting wire.

7. The display panel according to claim 1, wherein a material of the lap layer is selected from the group comprising molybdenum, titanium, aluminum, magnesium, silver, gold, copper, zinc, chromium, nickel, tungsten, and any combination thereof, and the lap layer is located in a same layer with the drain electrode of the driving layer group in the second display region.

8. The display panel according to claim 1, wherein a material of the first anode is a transparent conductive material.

9. The display panel according to claim 8, wherein the transparent conductive material is selected from the group comprising indium tin oxide, indium zinc oxide, silver-doped indium tin oxide, silver-doped indium zinc oxide, and any combination thereof.

10. The display panel according to claim 1, further comprising a second isolation layer located in the second display region, and the second isolation layer is disposed between the drain electrode of the driving layer group and the conducting wire; the second isolation layer comprises a fourth via hole, and the conducting wire is connected to the drain electrode of the driving layer group through the fourth via hole.

11. The display panel according to claim 10, wherein the first isolation layer and the second isolation layer are located in a same layer.

12. The display panel according to claim 11, wherein the first isolation layer is connected to the second isolation layer.

13. The display panel according to claim 12, wherein the first isolation layer and the second isolation layer form an integrated layer structure.

14. The display panel according to claim 10, wherein the driving layer group comprises a second flat region and a second climbing region, the second climbing region is adjacent to and connected to the second flat region, an orthographic projection of a side of the four via hole adjacent to the driving layer group on the driving layer group is located in the second flat region.

15. The display panel according to claim 1, wherein the anode layer further comprises a second anode located in the second display region;

wherein the display panel further comprises an organic light-emitting layer located on the anode layer, a first cathode located in the first display region and a second cathode located in the second display region;

wherein in the first display region, the organic light-emitting layer is located between the first anode and the first cathode; and wherein the second display region, the organic light-emitting layer is located between the second anode and the second cathode.

16. The display panel according to claim 1, wherein in an extending direction of the lap layer, a width of the lap layer changes continuously or changes intermittently, and a space between two adjacent lap layers changes continuously or changes intermittently; and wherein along the extending direction of the lap layer, at least a portion of an edge of the lap layer is arc-shaped or wave-shaped.

17. The display panel according to claim 1, further comprising a semiconductor layer located on the substrate and a gate insulating layer located on the semiconductor layer;

wherein the driving layer group further comprises a source electrode and a gate electrode, wherein the gate insulating layer is disposed between the semiconductor layer and the gate electrode; and wherein the source electrode and the drain electrode are respectively in contact with the semiconductor layer through a plurality of via holes of the gate insulating layer.

18. A display device, comprising the display panel according to claim 1.

19. The display device according to claim 18, further comprising a photosensitive device, the photosensitive device is corresponding to the first display region of the display panel, and the photosensitive device performs light collection via the first display region.

* * * * *